(12) United States Patent
Ozono et al.

(10) Patent No.: US 8,148,253 B2
(45) Date of Patent: Apr. 3, 2012

(54) ELECTRONIC COMPONENT SOLDERING STRUCTURE AND ELECTRONIC COMPONENT SOLDERING METHOD

(75) Inventors: Mitsuru Ozono, Fukuoka (JP); Tadahiko Sakai, Fukuoka (JP); Hideki Eifuku, Fukuoka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 11/816,558

(22) PCT Filed: Nov. 22, 2006

(86) PCT No.: PCT/JP2006/323874
§ 371 (c)(1),
(2), (4) Date: Aug. 17, 2007

(87) PCT Pub. No.: WO2007/061125
PCT Pub. Date: May 31, 2007

(65) Prior Publication Data
US 2009/0075025 A1 Mar. 19, 2009

(30) Foreign Application Priority Data
Nov. 25, 2005 (JP) .................................. 2005-339966

(51) Int. Cl.
*H01L 21/44* (2006.01)
(52) U.S. Cl. ................ 438/612; 438/108; 257/E21.509; 257/E21.51; 257/E21.511; 257/E23.023; 257/E23.026; 228/111.5; 228/180.1

(58) Field of Classification Search .................. 227/779; 228/175, 115.5, 180.1; 428/120; 257/737, 257/738, 779, E21.509, E21.51, E21.511, 257/E23.023, E23.026; 438/108, 612
See application file for complete search history.

(56) References Cited

U.S. PATENT DOCUMENTS

| 5,136,365 | A | * | 8/1992 | Pennisi et al. ................ 257/783 |
| 5,688,584 | A |   | 11/1997 | Casson et al. |
| 2001/0010324 | A1 | * | 8/2001 | Maeda et al. ................ 228/256 |
| 2003/0146266 | A1 | * | 8/2003 | Chaudhuri et al. ........... 228/175 |

FOREIGN PATENT DOCUMENTS
DE      19640192      4/1998
(Continued)

OTHER PUBLICATIONS
International Search Report Dated Jan. 30, 2007.

*Primary Examiner* — A. Sefer
*Assistant Examiner* — Farid Khan
(74) *Attorney, Agent, or Firm* — Pearne & Gordon LLP

(57) ABSTRACT

In an electronic component soldering method of connecting a terminal provided on a flexible substrate to an electrode of a rigid substrate, after solder-mixed resin in which solder particles are mixed in thermosetting resin has been applied onto the rigid substrate so as to cover the electrode, the flexible substrate is put on the rigid substrate and heat-pressed, whereby there are formed a resin part that bonds the both substrates by thermosetting of the thermosetting resin, and a solder part which is surrounded by the resin part and has narrowed parts in which the peripheral surface is narrowed inward in the vicinity of the terminal surface and in the vicinity of the electrode surface. Hereby, the solder parts are soldered to the electrodes and the terminal at acute contact angles so that the production of shape-discontinuities which lowers fatigue strength can be eliminated.

6 Claims, 6 Drawing Sheets

FOREIGN PATENT DOCUMENTS

| | | |
|---|---|---|
| EP | 0265077 | 4/1988 |
| EP | 1333079 | 8/2003 |
| JP | 06-085454 | 3/1994 |
| JP | 7-157720 | 6/1995 |
| JP | 8236911 A | 9/1996 |
| JP | 11-167971 | 6/1999 |
| JP | 11-176879 | 7/1999 |
| JP | 11-233912 | 8/1999 |
| JP | 2000332373 A | 11/2000 |
| JP | 3417110 | 4/2003 |

* cited by examiner

ELECTRONIC COMPONENT SOLDERING STRUCTURE AND ELECTRONIC COMPONENT SOLDERING METHOD

TECHNICAL FIELD

The present invention relates to electronic component soldering structure in which an electronic component such as a film-shaped flexible substrate is connected to another electronic component such as a rigid substrate, and to an electronic component soldering method for obtain this electronic component soldering structure.

BACKGROUND ART

An electron device which requires size reduction and high function, such as a mobile telephone or the like generally uses constitution in which individual functional modules such as a CCD camera, a display panel, and the like are connected to a main electronic circuit module provided for a rigid substrate through a film-shaped flexible substrate. As methods of connecting a terminal provided on this flexible substrate to a circuit electrode of the rigid substrate, there have been known a method of soldering this terminal to the circuit electrode by a solder precoating method (refer to, for example, JP-A-6-85454), and a method of electrically connecting the terminal and the circuit electrode by means of ACF (anisotropic conductive film) (refer to, for example, JP-A-11-233912 and JP-A-11-167971).

In the solder precoating method, a solder part is previously formed on the circuit electrode by tinning, and the flexible substrate is press-heated on the rigid substrate, whereby the solder part is melted and the melted solder part solders the terminal to the circuit electrode. Hereby, the terminal and the circuit electrode electrically conduct, and the flexible substrate is mechanically secured onto the rigid substrate at the solder joint portion.

Further, in the method using the ACF, thermosetting resin containing conductive particles is supplied onto the circuit electrode, and the flexible substrate is heat-bonded to the solid substrate, whereby the circuit electrode and the terminal are brought into contact with each other with the conductive particles between them, and the thermosetting resin thermosets. Hereby, the circuit electrode and the terminal electrically conduct, and the flexible substrate and the rigid substrate are bonded to each other by the thermosetting resin that has hardened.

Further, in the method using the ACF, a method which uses solder particles as the conductive particles has been proposed (refer to, for example, JP-A-11-176879 and Japanese Patent No. 3417110). In this method, the solder particles put between the circuit electrode and the terminal melt by thermocompression bonding thereby to solder the circuit electrode and the terminal to each other, whereby the circuit electrode and the terminal electrically conduct.

However, the related arts indicated in the above related art references have the following disadvantages caused by features of their respective methods. Firstly, in the solder precoating method, addition of the step of previously forming the solder part on the circuit electrode causes the increase of cost in the production process. Further, there are disadvantages in joint reliability such that: narrow-pitching of the circuit electrodes causes readily a bridge in which the melted solder hardens in a state where it is joined together between the adjacent electrodes in the soldering time; and limitation of the precoating solder quantity due to the narrow-pitching makes it difficult to sufficiently secure the joint keeping power required after the connection.

Further, the method using the ACF has disadvantages such that: material cost of the ACF itself is expensive; and since thermocompression bonding for connection requires long bonding time, productivity is low and cost reduction is difficult. Further, since the terminal and the circuit electrode conduct through the conductive particles put in the contact state, electric resistance is high at the connection part, so that it is difficult to secure connection reliability.

Further, since a high bonding load (10~20 MPa) is required in order to bring well the conductive particles into contact with the terminal and the circuit electrode, a large limitation exists for connection objects to which the connection by the ACF can be applied. Namely, in case that the rigid substrate is a multilayered substrate having inner wiring, or a double sided mounting substrate in which projections of electronic components mounted on the rear surface of the connection surface exist, stable backup capable of sufficiently supporting the bonding load is difficult, so that it is difficult to apply the connection by the ACF to such the substrate.

In order to solve the above problems in such the solder precoating method and connection method by the ACF, the method of using the solder particles as the conductive particles has been proposed as indicated in JP-A-11-176879 and Japanese Patent No. 3417110. However, in these related arts, there are the following problems caused by the shape of a solder part formed after the solder particles have soldered the terminal to the circuit electrode.

Namely, in case the solder particles are used as the conductive particles, the solder particles melt in a thermocompression bonding step. Therefore, regarding the shape of the solder part formed by cooling and hardening of the solder after the thermocompression bonding, a contact angle in the joint surface to the terminal or the circuit electrode becomes an obtuse angle, so that sharp shape-discontinuities are easy to be formed. Such the shape-discontinuities causes fatigue strength for heat cycle in a use state of the electronic components to lower greatly, with the result that connection-reliability is impaired. Thus, the conventional electronic component soldering structure which is applied to the electronic components such as the film-shaped substrate and the like has a problem that it is difficult to realize electronic component soldering structure capable of securing high connection-reliability at low cost and with high productivity in relation to various kinds of electronic components.

DISCLOSURE OF INVENTION

Therefore, it is an object of the invention to provide electronic component soldering structure and an electronic component soldering method, in which it is possible to secure high connection-reliability at low cost and with high productivity in relation to various kinds of electronic components.

Electronic component soldering structure of the invention, which is formed by connecting plural first electrodes provided on a first surface of a first electronic component to plural second electrodes provided on a second surface of a second electronic component, includes a resin part which lies between the first surface and the second surface which are opposed to each other, and which bonds the first ad second surfaces, and a substantially columnar solder part which is surrounded by the resin part and connects the first electrode and the second electrode corresponding to this first electrode. Herein, the solder part has, in at least two positions in the vicinity of the surface of the first electrode and in the vicinity of the surface of the second electrode, narrowed parts in which the peripheral surface is narrowed inward, so that contact angles of the solder part with the first electrode surface and with the second electrode surface become acute angles.

An electronic component soldering method of the invention, which is a method for obtaining the electronic component soldering structure of the invention, which is formed by connecting plural first electrodes provided on a first surface of a first electronic component to plural second electrodes provided on a second surface of a second electronic component, includes the steps of: a resin applying step of applying thermosetting resin containing solder particle onto the second surface; a part mounting step of mounting, on the second electronic component, the first electronic component in which the first surface has been heated at a temperature which is higher than a melting temperature of the solder particle, and bringing the first surface close to the second surface in the opposite state to each other; and a heat-press step of pressing the first electronic component on the second electronic component by a predetermined pressure force, and heating the solder particle and thermosetting resin through the first electronic component. Herein, in the part mounting step, the first electrode surface and the second electrode surface are brought into contact with the solder particles in the thermosetting resin, and these solder particles are melted firstly from the contact portion with the first electrode surface. Further, in the heat-press step, the first electronic component is pressed on the second electronic component with such pressure load that the solder particle in the melting state can retain the substantially spherical shape in the thermosetting resin, and heating of the solder particle and the thermosetting resin is continued through the first surface, whereby the solder part having the above narrowed parts is formed, and the resin part is formed by causing the thermosetting resin to thermoset.

According to the invention, the electronic component soldering structure formed by soldering the first electrode of the first electronic component to the second electrode of the second electronic component is composed of the resin part bonding these electronic components to each other, and the substantially columnar solder part surrounded by this resin part, and the shape of this solder part is so formed that the narrowed part in which the peripheral surface is narrowed inward exists in the vicinity of the electrode surface and the contact angle of the solder part with the electrode surface becomes the acute angle. Hereby, the invention can be applied to various kinds of electronic components, and high connection-reliability can be secured at low cost and with high productivity.

BEST MODE FOR CARRYING OUT THE INVENTION

Figure 1:
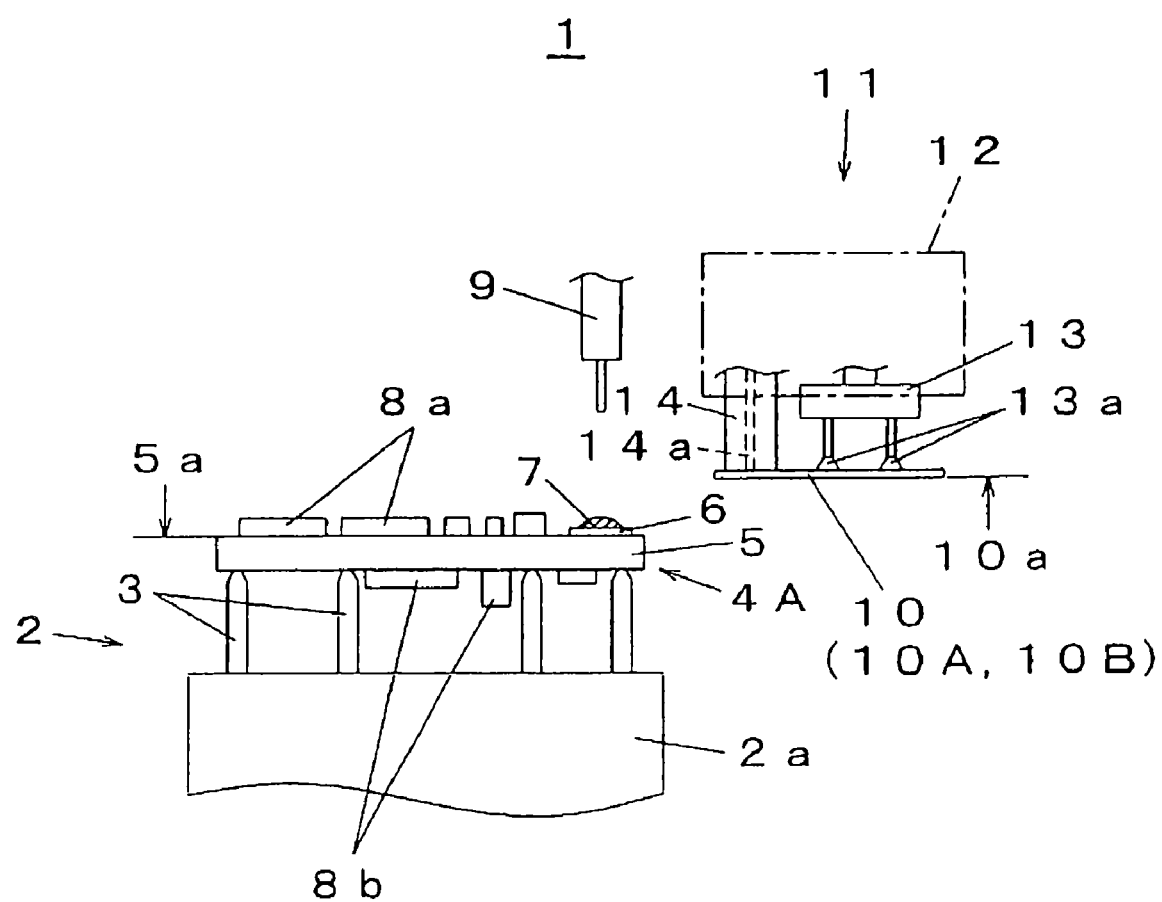
FIG. 1 is a sectional view of an electronic component mounting apparatus used in an electronic component soldering method according to one embodiment of the invention.
Figure 2:
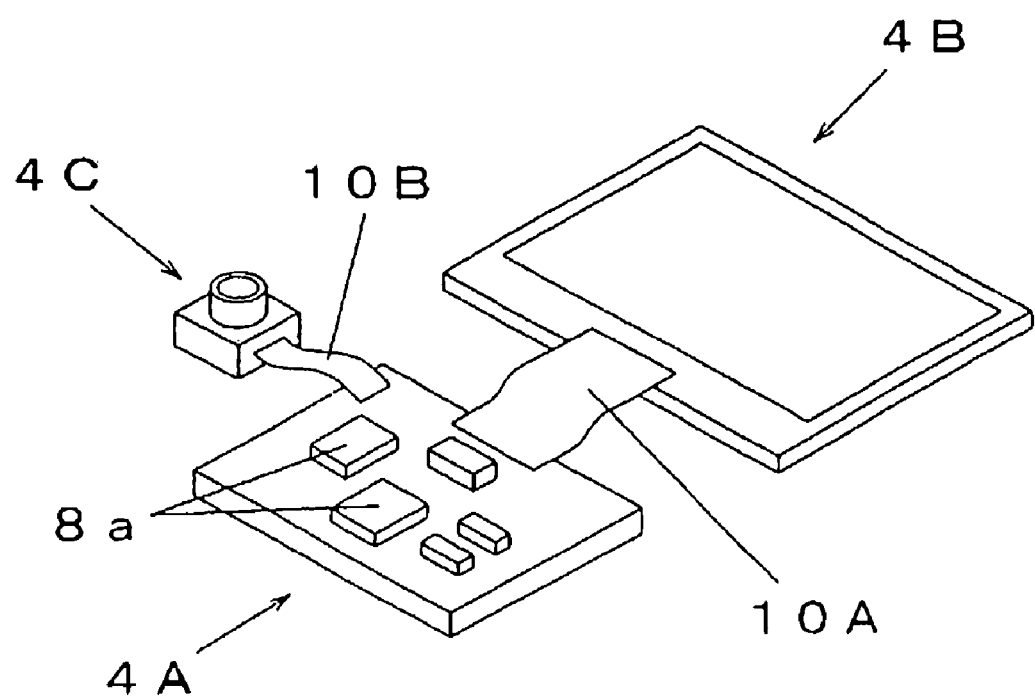
FIG. 2 is a perspective view of an electronic circuit module to which the electronic component soldering method according to one embodiment of the invention is applied.
Figure 3A:
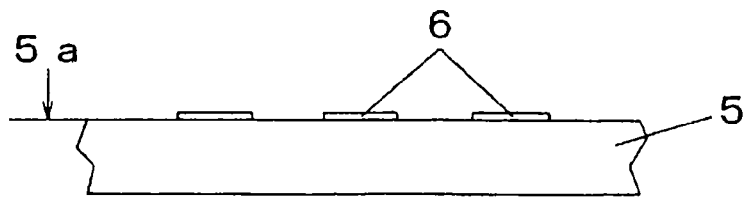
FIGS. 3A to 3D are figures for explaining a process in the electronic component soldering method according to one embodiment of the invention.
Figure 3B:
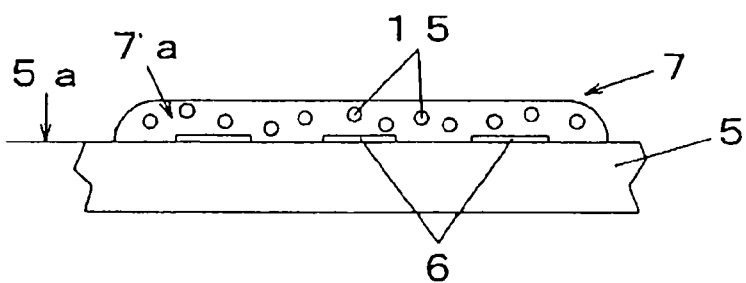
Figure 4A:
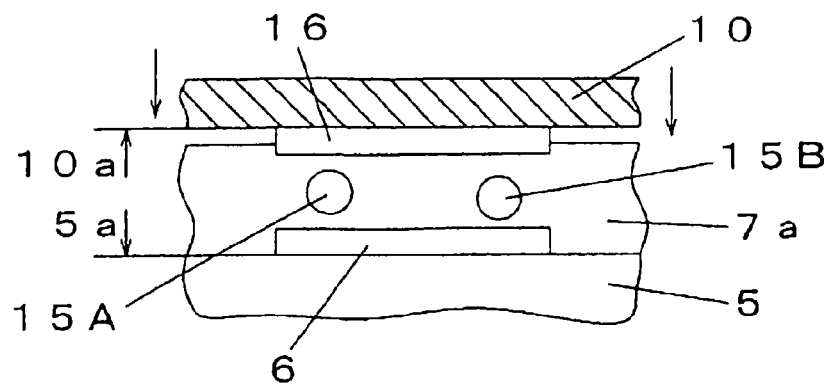
FIGS. 4A to 4D are figures for explaining a process in the electronic component soldering method according to one embodiment of the invention.
Figure 5:
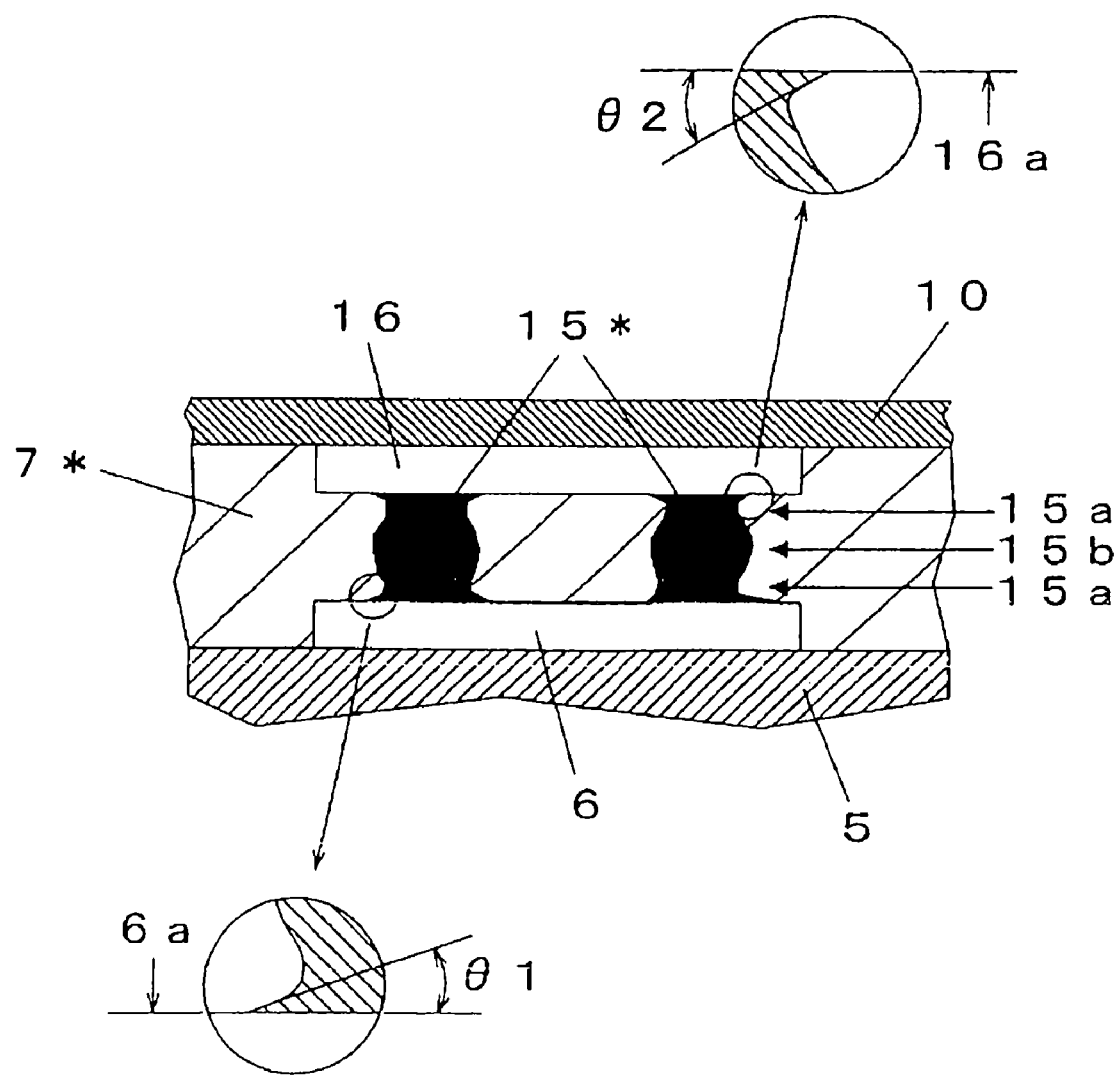
FIG. 5 is a sectional view of electronic component soldering structure according to one embodiment of the invention.
Figure 6:
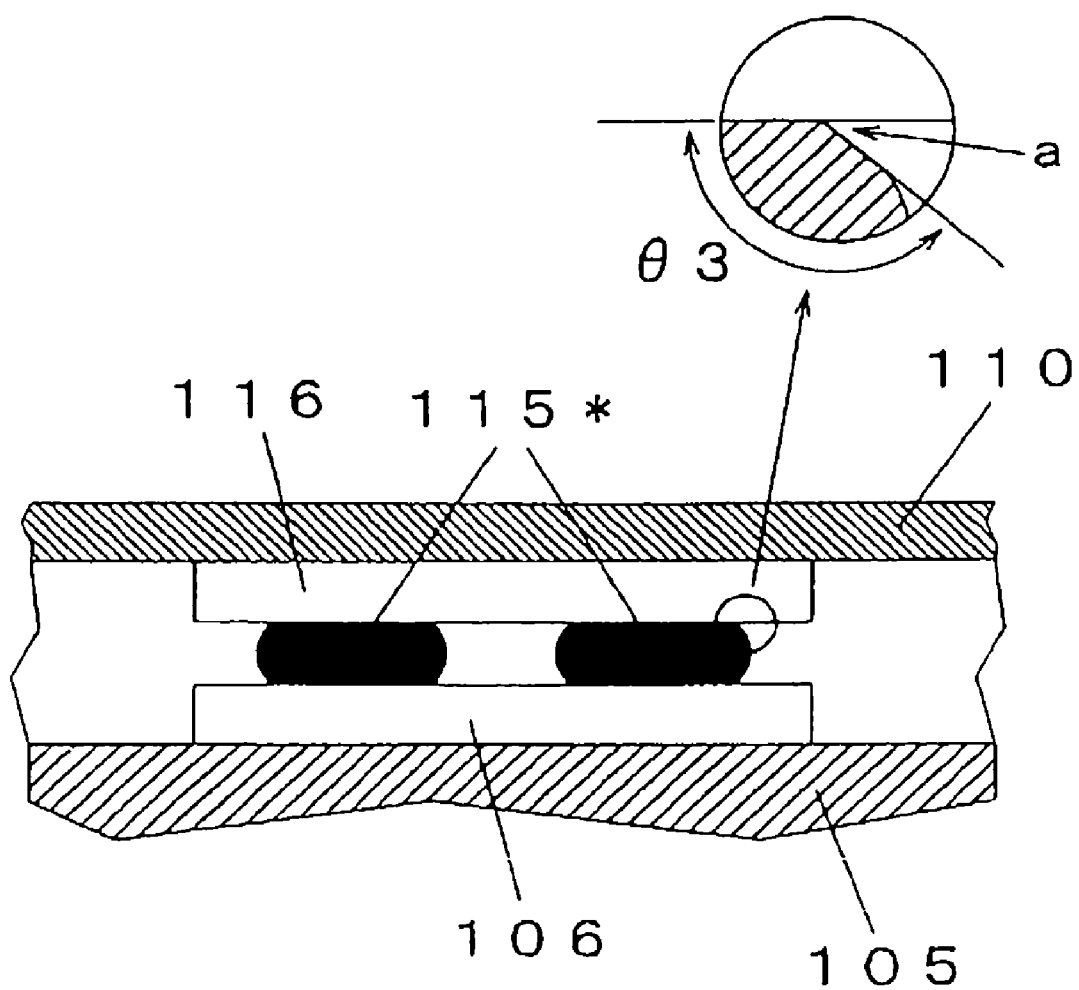
FIG. 6 is a sectional view of conventional electronic component soldering structure.

Next, an embodiment of the invention will be described with reference to drawings. FIG. 1 is a sectional view of an electronic component mounting apparatus used in an electronic component soldering method in one embodiment of the invention, FIG. 2 is a perspective view of an electronic circuit module to which an electronic component soldering method according to one embodiment of the invention is applied, FIGS. 3A to 3D and 4A to 4D are figures for explaining a process in the electronic component soldering method according to one embodiment of the invention, FIG. 5 is a sectional view of electronic component soldering structure according to one embodiment of the invention, and FIG. 6 is a sectional view of conventional electronic component soldering structure.

Referring first to FIG. 1, constitution of an electronic component mounting apparatus 1 used in an electronic component soldering method of the invention will be described. The electronic component mounting apparatus 1 has a function of connecting a film-shaped flexible substrate electrically to a rigid substrate on which electronic components have been already mounted, and is used for connecting electronic circuit modules such as a control substrate module 4A, a display panel module 4B, and a camera module 4C through flexible substrates 10 to one another as shown in FIG. 2. In an example shown in FIG. 2, to the control substrate module 4A constituted by mounting electronic components 8 onto a rigid substrate 5, the display panel module 4B having a display panel such as a liquid crystal panel as a main component is connected through a flexible substrate 10A, and further, the camera module 4C in which a CCD camera is built is connected thereto through a flexible substrate 10B.

As shown in FIG. 1, the electronic component mounting apparatus 1 includes a substrate holder 2, a dispenser 9 and a bonding mechanism 11. The flexible substrate 10 that is a first electronic component is held by the bonding mechanism 11, and heat-bonded to the rigid substrate 5 that is a second electronic component held by the substrate holder 2. On a terminal forming surface 10a (first surface) of the flexible substrate 10, a terminal 16 that is a first electrode (refer to FIG. 3C) is provided. The terminal 16 is connected to an electrode 6 for external connection provided at an end portion of a connection surface 5a (second surface) of the rigid substrate 5, whereby the flexible plate 10 is connected to the rigid substrate 5.

The substrate holder 2 is formed by plural backing pins 3 provided upright on a holding table 2a, and the backing pins 3 back up and support the lower surface of the rigid substrate 5 in the control, substrate module 4A. On the connection surface 5a of the rigid substrate 5, plural kinds of electronic components 8a have been mounted in the previous step; and also on the opposite surface to the connection surface 5a, electronic components 8b have been already mounted similarly. The backing pin 3 is arranged selectively on the lower surface of the rigid substrate 5 in a backup enabling portion where the electronic component 8b does not exist.

The upper surface of the rigid substrate 5 becomes the connection surface 5a on which the electrode 6 connected to the flexible substrate 10 is provided, and the electrode 6 is coated with solder-mixed resin 7 by the dispenser 9 prior to the connection with the flexible substrate 10. The solder-mixed resin 7 is composed by mixing solder particles 15

(refer to FIG. 3) having a predetermined particle size in thermosetting resin. As material of the solder particle 15, SnAg based-, SnZn based-, and SnBi based-solders can be used, which are used generally in assembly of an electronic circuit. Preferably, SnBi based-solder is good, and particularly, 42SnBi eutectic solder (melting point 139° C.) is most suitable. Average particle size of the useable solder particle 15 is 5 μm to 30 μm. As the thermosetting resin, epoxy based-resin and acryl based-resin are used, which have such thermosetting characteristics that thermosetting starts at a temperature that is lower than a melding point of the solder particle 15 and hardening is performed in a comparatively short time.

The bonding mechanism 11 has a work head 12 which can move in relation to the substrate holder 2 in a horizontal direction and in an up-and-down direction. To the work head 12, a holding head 13 and a thermo compression bonding tool 14 are attached. The holding head 13, by plural suction holding pads 13*a*, sucks the flexible substrate 10 (flexible substrate 10A or flexible substrate 10B) from the opposite surface side to the terminal forming surface 10*a* side. The thermocompression bonding tool 14 sucks a connection portion in the flexible substrate 10 in which the terminal 16 is provided, from the opposite surface side to the terminal forming surface 10*a* side through a suction hole 14*a*.

The thermocompression bonding tool 14 includes a press unit which presses the flexible substrate 10 on the rigid substrate 5, and a heating unit which heats the flexible substrate 10 by transmission of contact heat. In a state where the flexible substrate 10 is aligned with the rigid substrate 5 by moving the work head 12, and the end portion of the flexible substrate 10 is put on the electrode 6 of the rigid substrate 6 through the solder-mixed resin 7, the flexible substrate 10 is heated and pressed in relation to the rigid substrate 5 by the thermocompression bonding tool 14, whereby the flexible substrate 10 is connected to the rigid substrate 5.

Namely, the electrode 6 and the terminal 16 are electrically connected by the solder particle which has melted and hardened in the solder-mixed resin 7, and the rigid substrate 5 and the flexible substrate 10 are bonded by the resin part in which the thermosetting resin in the solder-mixed resin 7 has thermoset. Hereby, the plural terminals 16 (first electrodes) provided on the terminal forming surface 10*a* (first surface) of the flexible substrate 10 (first electronic component) are connected to the plural electrodes 6*a* (second electrodes) provided on the connection surface 5*a* (second surface) of the rigid substrate 5 (second electronic component) whereby electronic component soldering structure is constructed.

Next, referring to FIGS. 3A to 3D and 4A to 4D, an electronic component soldering method of connecting the flexible substrate 10 to the rigid substrate 5 will be described. As shown in FIG. 3A, on the connection surface 5*a* of the rigid substrate 5 held by the substrate holder 2, the plural electrodes 6 are formed. Onto the connection surface 5*a*, as shown in FIG. 3B, the solder-mixed resin 7 in which the solder particles 15 are included in the thermosetting resin 7*a* is applied by the dispenser 9 so as to cover the electrodes 6. Namely, the thermosetting resin including the solder particles is applied onto the connection surface 5*a* that is the second surface (resin applying step). Here, a rate of the solder particles 15 contained in the solder-mixed resin 7 is set so that the plural solder particles 15 are always interspersed above each electrode 6 in the state where the solder-mixed resin 7 is applied onto the connection surface 5*a*.

Next, the work head 12 performs mounting of the flexible substrate 10. Firstly, the flexible substrate 10 is vacuum-held by the holding head 13. At this time, the position of the thermocompression bonding tool 14 is adjusted so that the tool 14 is located right over the terminals 16. Further, the flexible substrate 10 is previously heated by the thermocompression bonding tool 14 so that the temperature of the lower surface of the terminal 16 increases up to the melting temperature of the solder particle 15 or more.

Figure 3C:
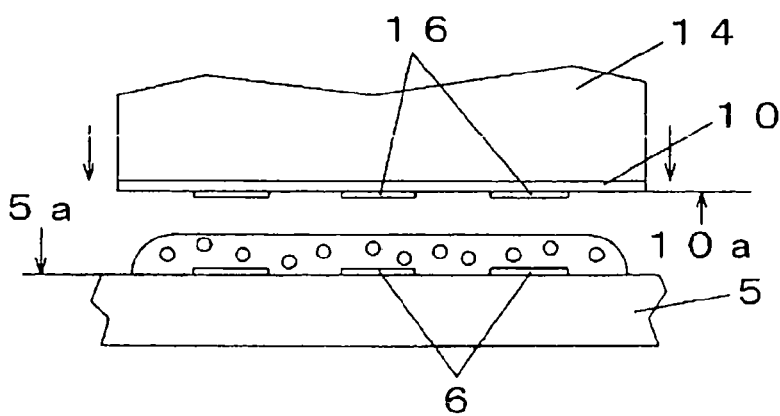

Thereafter, the work head 12 is moved to oppose the terminal forming surface 10*a* and the connection surface 5*a* to each other as shown in FIG. 3C, and the terminal 16 is aligned with the electrode 6. Next, the thermocompression bonding tool 14 is permitted to descend to bring the terminal forming surface 10 close to the connection surface 5*a*, and the terminal 16 is brought into contact with the electrode 6 corresponding to this terminal 16 through the solder-mixed resin 7. Namely, the flexible substrate 10 of which the terminal forming surface 10*a* has been heated at the temperature that is higher than the melting temperature of the solder particle 15 is mounted on the rigid substrate 5, and the terminal forming surface 10*a* is brought close to the connection surface 5*a* in the opposite state to the connection surface 5*a* (part mounting step).

Figure 3D:
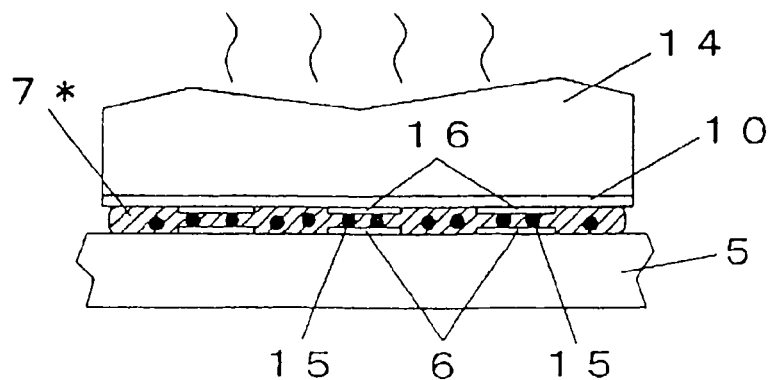

Next, as shown in FIG. 3D, the flexible substrate 10 is pressed on the rigid substrate 5 with a predetermined pressure load by the thermocompression bonding tool 14, and the thermosetting resin 7*a* and the solder particle 15 are heated through the flexible substrate 10 by the thermocompression bonding tool 14 (heat-press step). Herein, as a press condition, a pressure load of the thermocompression bonding tool 14 is set in a pressure range of 1 to 4 MPa. Thus, the set pressure load is lower than the pressure load (10 to 20 MPa) in the conventional electronic component soldering method by the thermocompression bonding. Therefore, in a heat-press step described below, in a state where the solder particle that has already melted, without being compressed, retains generally its original particle form, a solder part is formed.

The motion and condition change of the solder particle 15 in the above part mounting step and heat-press step will be described with reference to FIGS. 4A to 4D. FIG. 4A shows a state where the terminal 16 comes into contact with the solder-mixed resin 7 in an operation of causing the thermocompression tool 14 to descend and bringing the terminal forming surface 10*a* close to the connection surface 5*a*. At this time, between the electrode 6 and the terminal 16, the plural solder particles 15 exist. FIGS. 4A to 4D show an example in which two solder particles 15 exist. In order to distinguish between their two solder particles, they will be described below as solder particles 15A and 15B.

Figure 4B:
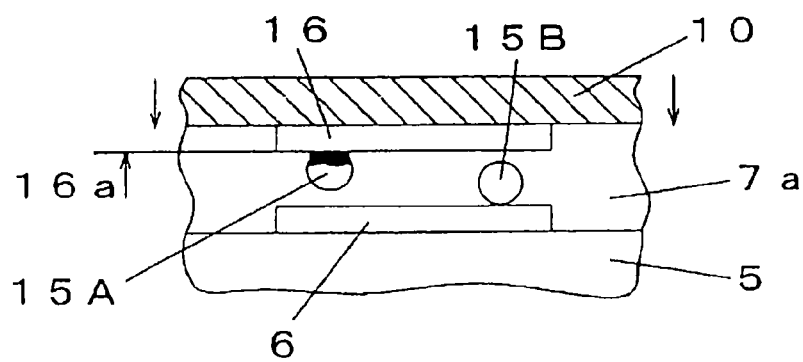

Thereafter, by causing the thermocompression bonding tool 14 to descend more, as shown in FIG. 4B, the terminal surface 16*a* comes into contact with the solder particle 15A located in the upper position in the solder-mixed resin 7. Hereby, the solder particle 15A is heated by heat transmission from the terminal surface 16*a* which has been heated to the melting temperature of the solder or more, and starts melting from this contact surface with the terminal surface 16*a*. In the figure, a melted portion of the solder particle 15 is shown in black color. The melted solder spreads along the terminal surface 16*a*, and wets the terminal surface 16*a* in the range that is wider than the contact surface in the contact starting time. At this time, the solder particle 15B has not come into contact with the terminal surface 16*a* yet.

Figure 4C:
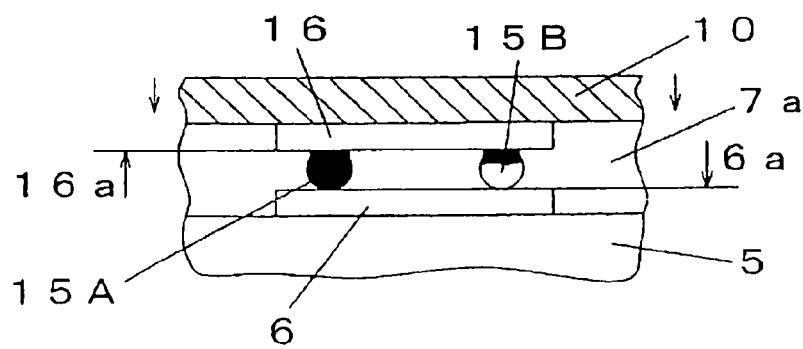

Thereafter, when the flexible substrate 10 descends more, the solder particle 15B also comes into contact with the terminal surface 16*a*. Next, as shown in FIG. 4C, both of the solder particle 15A and the solder particle 15B come to be interposed between the electrode surface 6*a* and the terminal surface 16*a*. At this time, the solder particle 15A which has come firstly into contact with the terminal surface 16*a* is put in a completely melting state prior to the solder particle 15B, and the solder particle 15B which has come later into contact with the terminal surface 16a is put in a state where it is starting to melt from its contact surface with terminal surface 16a.

Figure 4D:
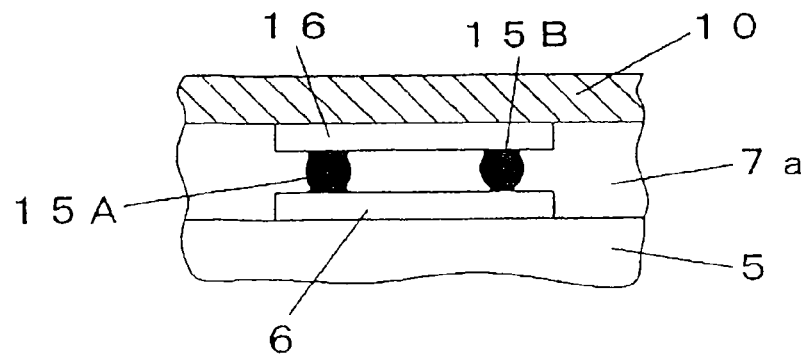

In this state, the thermosetting resin 7a is heated through the flexible substrate 10, whereby thermosetting proceeds, which prevents the flow of the solder particle 15A, 15B which has melted or is melting. When heating is continued more, as shown in FIG. 4D, both of the solder particles 15A and 15B completely melt and are soldered to the electrode surface 6a and the terminal surface 16a, a substantially columnar solder part 15* connecting the terminal 16 and the electrode 6 is formed, and the thermosetting resin 7a which has thermoset forms a resin part 7* covering the surroundings of the solder part. Hereby, the electronic component soldering structure which connects the flexible substrate 10 to the rigid substrate 5 finishes.

Next, referring to FIG. 5, the thus formed electronic component connection structure will be described.

In FIG. 5, between the flexible substrate 10 and the rigid substrate 5, the resin part 7* that is a hardening matter obtained by thermosetting of the thermosetting resin 7a in the solder-mixed resin 7 is formed. The resin part 7* exists between the terminal forming surface 10a and the connection surface 5a which are opposed to each other, and bonds the both surfaces. The electrode 6 and the terminal 16 are connected to each other by the solder part 15* formed by melting and hardening of the solder particles 15A and 15B.

The surroundings of the solder part 15* are covered with the resin part 7*, and the solder part 15* connects the terminal 16 to the electrode 6 corresponding to this terminal 16. Herein, a mixed rate of the solder particles 15 in the solder-mixed resin 7 is appropriately set, whereby two or more solder parts 15* exist between the terminal 16 and the electrode 6 corresponding to this terminal 16. Since the plural solder parts 15* thus connect between the electrodes by soldering, compared with the structure in which conduction between the electrodes is performed by the contact through the conductive particles in the connection using the ACF, connection structure having low electric resistance and high reliability is realized.

Next, the shape of the thus formed solder part 15* will be described. The solder part 15*, as described before, melts and hardens in the state where the surroundings of the solder particle 15 are covered with the thermosetting resin 7a which is thermosetting. Further, since only the low pressure load is applied to the solder particle 15 in this step, the solder particle 15 after melting melts and hardens while retaining its original shape as a whole, except for the contact portions with the terminal surface 16a and with the electrode surface 6a.

Namely, when the solder particle 15 comes into contact with the terminal surface 16a and the electrode surface 6a, the melted solder is permitted to spread along the contact surfaces in a wet condition, at the contact portions of the solder part 15 with the terminal surface 16a and the electrode surface 6a, with good wettability, because an oxide film on the surface of the solder particle 15 is broken at the contact portions of the solder part 15 with the terminal surface 16a and the electrode surface 6a, or because the oxide film is removed by the active action of the thermosetting resin 7a. Therefore, in both of the upper and lower ends of the solder part 15*, in portions soldered to the electrode surface 6a and the terminal surface 16a, as shown in a partially enlarged view in FIG. 5, joints each having a contact angle θ1 or θ2 that is an acute angle are formed.

Due to such the shape of the joint, in the solder part 15*, in the vicinity of the terminal surface 16a and in the vicinity of the electrode surface 6a, narrowed parts 15a are formed, which has the shape in which the peripheral surface is narrowed inward. Between their two narrowed parts 15a, a bulge part 15b is formed, which has the shape in which the solder particle 15 retains generally its original shape and which bulges outward in relation to the narrowed part 15a. Namely, the solder part 15* has, in at least two positions in the vicinity of the terminal surface 16a that is the surface of the terminal 16 and in the vicinity of the electrode surface 6a that is the surface of the electrode 6, the narrowed parts 15a each having the shape in which the peripheral surface is narrowed inward; the shape in which the contact angles with the terminal surface 16a and with the electrode surface 6a are acute angles; and further the bulge part 15b which is formed between the narrowed parts 15a formed in these two positions and bulges in the peripheral direction.

Namely, in the part mounting step in the before-described electronic component soldering method, the terminal surface 16a of the terminal 16 and the electrode surface 6a of the electrode 6 are brought into contact with the solder particle 15 in the thermosetting resin 7a, and this solder particle 15 is melted firstly from the contact portion with the terminal surface 16a of the terminal 16; and in the heat-press step, the flexible substrate 10 is pressed on the rigid substrate 5 with such the pressure load that the solder particle 15 in the melting state can retain the substantially spherical shape in the thermosetting resin 7a, and heating of the solder particle 15 and the thermosetting resin 7a is continued through the terminal forming surface 10a, whereby the solder part 15* having the above narrowed parts 15a is formed, and the resin part 7* is formed by causing the thermosetting resin 7a to thermoset.

Such the shape of the solder part 15* has the following features, compared with the electronic component soldering structure using as the connection material the solder-mixed resin having the similar constitution in which the solder particles are mixed in the thermosetting resin. FIG. 6 shows conventional electronic component soldering structure formed by connecting a flexible substrate 110 having a terminal 116 to a substrate 105 having an electrode 106 similarly to the case in the embodiment.

Namely, in the soldering structure by the conventional technology, a solder part 115* connecting the terminal 116 and the electrode 16 is easy to be formed in the compressed shape in the up-and-down direction by the pressure load in the melting time, and joints of the solder part 115* with the terminal 116 and the electrode 106 are formed in the joint shape having a contact angle θ3 that is an obtuse angle. Therefore, the solder part 115* comes to have shape-discontinuities as shown by an arrow a, so that it is unavoidable that fatigue strength for thermal stress due to heat cycle produced in the using state after connection lowers. To the contrary, in the electronic component soldering structure of the invention, since the solder part 15* is joined to each electrode at the acute contact angle, the shape-discontinuities do not exist, and the electronic component soldering structure which is good in fatigue-resistant strength is realized.

In the above embodiment, though an example in which the film-shaped flexible substrate 10 as the first electronic component is connected to the rigid substrate 5 is indicated, the invention is not limited to this. For example, also in case that a semiconductive part having a metal bump or a projection electrode such as a connection terminal on a connection surface is directly connected to a rigid substrate, the invention can be applied.

As described above, the electronic component soldering structure indicated in the embodiment, which is formed by connecting the terminal 16 of the flexible substrate 10 to the electrode 6 of the rigid substrate 5, is constituted by the resin part 7\* which bonds these electronic components to each other, and the substantially columnar solder part 15\* which is surrounded by this resin part 7\*. Herein, the solder part 15\* is so formed that: the narrowed parts 15*a* in which the peripheral surface is narrowed inward in the vicinity of the terminal 16 surface and in the vicinity the electrode 6 surface are provided; and the contact angles with the terminal 16 and the electrode 6 become acute angles.

In order to realize such the electronic component soldering structure, the solder-mixed resin 7 in which the solder particles 15 are mixed in the thermosetting resin 7*a* is previously applied onto the electrode 6, the flexible substrate 10 in which the terminal 16 has been previously heated at a temperature that is higher than the solder melting point is pressed through the solder-mixed resin 7 on the rigid substrate 5 with low pressure load, and the solder particle 15 is melted and hardened in a state where the solder particle 15 retains its shape to the utmost, whereby the solder part 15\* having the above shape is obtained.

Hereby, compared with the conventional electronic component soldering method applied to the similar electronic components, the following excellent advantages can be obtained. Firstly, compared with the solder precoating method, since the step of previously forming the solder part on the circuit electrode is added in this solder precoating method, the increase of cost on the production process is unavoidable. However, in the embodiment of the invention, immediately after applying the solder-mixed resin 7 on the electrode, thermocompression bonding is performed, thereby to simplify the process very much. Further, since the quantity of the solder particles 15 mixed in the solder-mixed resin 7 is appropriately set, even in case that the electronic component soldering method of the invention is applied to the narrow pitch electrode, it is possible to prevent occurrence of a bridge between the electrodes. Further, by the reinforcement effect of the resin part 7\*, the joint retaining power can be sufficiently secured.

Further, compared with the method using the ACF, since the cheap bonding material in which solder particles are mixed in thermosetting resin is used in place of the expensive ACF in the invention, low running cost can be realized. Further, compared with the thermocompression bonding with the ACF, the connection is completed in a short bonding time, and high productivity can be realized, so that cost reduction can be promoted, coupled with the low running cost.

Further, since it is not necessary to perform the thermocompression bonding with the high pressure load in order to obtain low connection resistance, unlike the method by the ACF, even in case that the invention is applied to a multilayered substrate having inner wiring, or a kind of substrate in which existence of projections on the rear surface of the connection surface makes backing of high load impossible, such as a dual sided mounting substrate, the low connection resistance can be realized with low pressure load. Thus, according to the electronic component soldering structure and electronic component soldering method indicated in the embodiment, for various kinds of electronic components, high connection reliability can be secured at low cost and with high productivity.

INDUSTRIAL APPLICABILITY

The electronic component soldering structure and electronic component soldering method of the invention have an advantage that, for various kinds of electronic components, high connection reliability can be secured at low cost and with high productivity. Therefore, the invention can be applied to a field in which a film-shaped flexible substrate is bonded to an electrode provided on a rigid substrate in a small-sized portable electron device or the like.

The invention claimed is:

1. An electronic component soldering method, which is a method for obtaining an electronic component soldering structure which is formed by soldering plural first electrodes provided on a first surface of a first electronic component to plural second electrodes provided on a second surface of a second electronic component, the method comprising the steps of:
    a resin applying step of applying thermosetting resin containing solder particles onto the second surface;
    a part mounting step of mounting on the second electronic component the first electronic component in which the first surface has been heated at a temperature that is higher than a melting temperature of the solder particles, and bringing the first surface close to the second surface in the opposite state to each other; and
    a heat-press step of pressing the first electronic component on the second electronic component by a predetermined pressure force, and heating the solder particles and thermosetting resin by heat transmission from the first surface of the first electronic component, wherein
    in the part mounting step, the surface of one of the plural first electrodes and the surface of a corresponding one of the plural second electrodes are brought into contact with the solder particles in the thermosetting resin, and these solder particles are melted firstly from the contact portion with the surface of the one of the plural first electrodes, and
    in the heat-press step, the predetermined pressure force is controlled at such pressure load that the solder particles in the melting state can retain a substantially spherical shape in the thermosetting resin, and heating of the solder particles and the thermosetting resin is continued from the first surface, whereby the solder part having narrowed parts is formed, and the resin part is formed by causing the thermosetting resin to thermoset.

2. The electronic component soldering method according to claim 1, wherein two or more solder parts exist between the one of the plural first electrodes and the corresponding one of the plural second electrodes.

3. The electronic component soldering method according to claim 1, wherein the solder part has a bulge part which is located between said narrowed parts and bulges in a peripheral direction thereof.

4. The electronic component soldering method according to claim 1, wherein the resin part is made of a hardened thermosetting resin.

5. The electronic component soldering method according to claim 1, wherein the first electronic component is a film-shaped flexible substrate.

6. The electronic component soldering method according to claim 1, wherein the first electronic component is a semiconductive part having a projection electrode.

* * * * *